(12) United States Patent
Shirai et al.

(10) Patent No.: US 7,622,727 B2
(45) Date of Patent: Nov. 24, 2009

(54) EXTREME UV RADIATION SOURCE DEVICE

(75) Inventors: Takahiro Shirai, Shizuoka (JP); Kyohei Seki, Himeji (JP)

(73) Assignee: Ushiodenki Kabushiki Kaisha, Tokyo (JP)

( * ) Notice: Subject to any disclaimer, the term of this patent is extended or adjusted under 35 U.S.C. 154(b) by 32 days.

(21) Appl. No.: 11/617,163

(22) Filed: Dec. 28, 2006

(65) Prior Publication Data
US 2007/0158594 A1 Jul. 12, 2007

(30) Foreign Application Priority Data
Dec. 28, 2005 (JP) ............................. 2005-377186

(51) Int. Cl.
*H01J 7/36* (2006.01)
*H05H 1/00* (2006.01)

(52) U.S. Cl. .............................. 250/504 R; 250/423 R; 250/425; 250/493.1; 313/232; 313/163; 313/172; 313/165

(58) Field of Classification Search ............. 250/504 R, 250/503.1, 493.1, 378, 30, 238, 505.1, 492.2, 250/492.1, 396 R, 400, 423 R, 425, 458.1, 250/461.1, 491.1, 492.3; 395/94; 378/119, 378/134, 135, 136; 257/620; 427/523; 313/232, 313/163, 172, 165, 326
See application file for complete search history.

(56) References Cited

U.S. PATENT DOCUMENTS 5,945,677 A * 8/1999 Leung et al. ............ 250/396 R 6,188,076 B1 2/2001 Silfvast et al.
6,804,327 B2 10/2004 Schriever et al.

(Continued)

FOREIGN PATENT DOCUMENTS

EP    1 349 010 A1    10/2003

(Continued)

OTHER PUBLICATIONS

Present Status and Future of EUV (Extreme Ultra Violet) Ligh Source Research , J. Plasma Fusion Res., vol. 79, No. 3 (Mar. 2003), pp. 219-260.

(Continued)

*Primary Examiner*—Jack I Berman
*Assistant Examiner*—Nicole Ippolito Rausch
(74) *Attorney, Agent, or Firm*—David S. Safran; Roberts Mlotkowski Safran & Cole, P.C.

(57) ABSTRACT

An EUV radiation source device with a chamber that is divided into a discharge space and a collector mirror space provided with EUV collector optics. Between them, an aperture component with an opening which is cooled is provided. First and second discharge electrodes are rotated. Sn or Li is irradiated with a laser. Pulsed power is applied between the first and second discharge electrodes to form a high density and high temperature plasma between the two electrodes so that EUV radiation with a wavelength of 13.5 nm is emitted, is focused by the EUV collector optics and is guided into the irradiation optical system of an exposure tool. There are a first pumping device and a second pumping device for pumping the discharge space and the collector mirror space. The discharge space is kept at a few Pa, and the collector mirror space is kept at a few 100 Pa.

9 Claims, 7 Drawing Sheets

U.S. PATENT DOCUMENTS

| | | | |
|---|---|---|---|
| 6,855,945 B1* | 2/2005 | Silder | 250/505.1 |
| 6,882,704 B2* | 4/2005 | Schriever et al. | 378/119 |
| 7,141,798 B2* | 11/2006 | Ito et al. | 250/372 |
| 7,372,057 B2* | 5/2008 | Gaebel et al. | 250/504 R |
| 7,402,825 B2* | 7/2008 | Simmons et al. | 250/493.1 |
| 2001/0006217 A1* | 7/2001 | Bisschops | 250/493.1 |
| 2003/0146396 A1* | 8/2003 | Loopstra | 250/492.2 |
| 2004/0184014 A1* | 9/2004 | Bakker et al. | 355/30 |
| 2004/0251410 A1* | 12/2004 | Sainty | 250/292 |
| 2007/0090304 A1* | 4/2007 | Jonkers et al. | 250/504 R |

FOREIGN PATENT DOCUMENTS

| | | |
|---|---|---|
| EP | 1 434 098 A2 | 6/2004 |
| EP | 1 591 833 A2 | 11/2005 |
| WO | 2005/015962 A2 | 2/2005 |
| WO | 2005 025280 A2 | 3/2005 |
| WO | 2005 101924 A1 | 10/2005 |

OTHER PUBLICATIONS

EUV Sources Using Xe and Sn Discharge Plasmas, Borisov et al., J. Phys. D: Appl. Phys. 37 (2004) pp. 3254-3265.

* cited by examiner

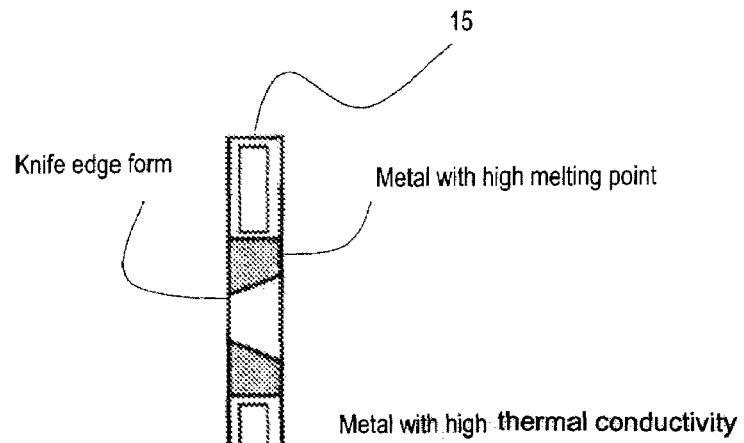
Fig. 2a
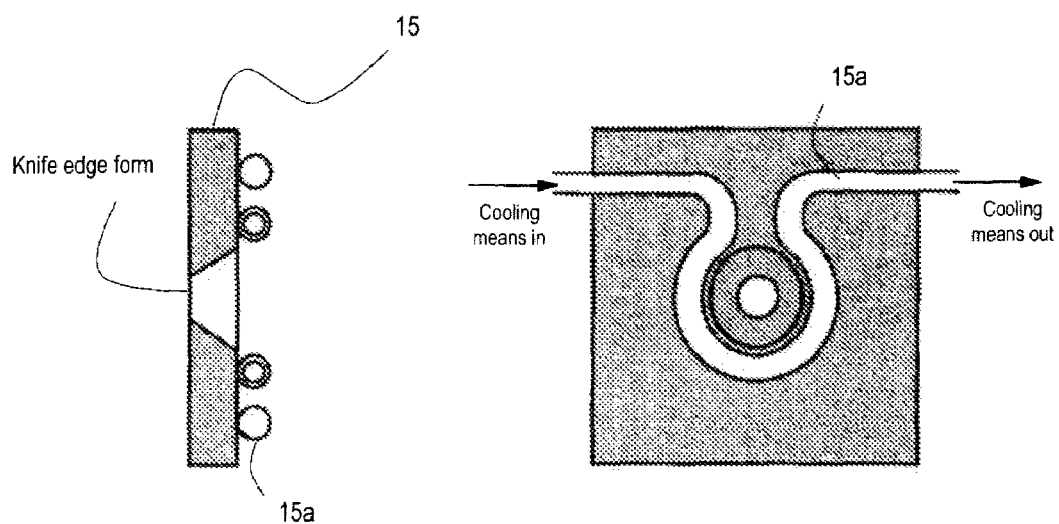
Fig. 2b
Fig. 2c

EXTREME UV RADIATION SOURCE DEVICE

BACKGROUND OF THE INVENTION

1. Field of the Invention

The invention relates to an extreme UV radiation source device which emits extreme UV radiation. The invention also relates to an extreme UV radiation source device in which, by rotating the discharge electrodes which constitute means for heating and excitation of extreme UV radiating fuel, the extreme UV radiating fuel is heated and excited and in which extreme UV radiation is thus produced.

2. Description of Related Art

According to the miniaturization and increased integration of an integrated semiconductor circuit, an increase in resolution is required in a projection exposure tool for purposes of its manufacture. To meet this requirement, the wavelengths of the exposure light source are being increasingly shortened. As a semiconductor exposure light source of the next generation in succession to an excimer laser device, an extreme UV radiation source device (hereinafter also called an EUV radiation source device) is being developed which emits extreme UV radiation (hereinafter also called EUV (extreme ultraviolet) radiation) with wavelengths from 13 nm to 14 nm, especially with a wavelength of 13.5 nm.

Several schemes are known for producing EUV radiation in an EUV radiation source device. In one, by heating and excitation of an EUV source fuel, a high density and high temperature plasma is produced and EUV radiation is extracted from this plasma.

This EUV radiation source device is, for the most part, divided based on the method of producing a high density and high temperature plasma into an EUV radiation source device of the LPP (Laser Produced Plasma) type and into an EUV radiation source device of the DPP (Discharge Produced Plasma) type (for example, reference is made to the publication "Current status of research on EUV (extreme ultraviolet) radiation sources for lithography and future prospects" J. Plasma. Fusion Res. Vol. 79, No. 3, pp 219-260, Mar. 2003 (hereafter Publication 1).

In an EUV radiation source device of the LPP type, EUV radiation from a high density and high temperature plasma is used which is formed by irradiated targets such as solids, liquid, gas and the like which are irradiated with a pulsed laser.

On the other hand, in an EUV radiation source device of the DPP type, EUV radiation from a high density and high temperature plasma which has been produced by power current driving is used. The discharge method in an EUV radiation source device of the DPP type is a Z pinch method, a capillary discharge method, a dense plasma focus method, a hollow cathode triggered Z-pinch method and the like.

In the above described EUV radiation source devices of the two types, the radiating fuel for emission of EUV radiation with a wavelength of 13.5 nm, i.e., the fuel for the high density and high temperature plasma, is currently, for example, decavalent xenon (Xe) ions. Furthermore, the fuels for obtaining a greater radiation intensity of the EUV radiation are lithium (Li) ions and tin (Sn) ions. For tin, the ratio of the electrical input necessary to form the high density and high temperature plasma to the output of the EUV radiation with a wavelength of 13.5 nm, i.e., the EUV conversion efficiency (=EUV energy/input energy for discharge) is several times higher than for xenon. For tin and lithium, the EUV conversion efficiency is also greater than in xenon. Therefore, tin and lithium are regarded as best for use as the radiating fuel of an EUV radiation source with a large output.

The EUV radiation source of the DPP type compared to the EUV radiation source of the LPP type has the advantages of enabling a small EUV radiation source device and a small power consumption. Practical use in the market is strongly expected.

On the other hand, as was described above, in an EUV radiation source device of the DPP type, EUV radiation from a high density and high temperature plasma which has been produced by power current driving as a result of a discharge is used. The means for heating and excitation of the EUV radiating fuel is a large current as a result of a discharge which has formed between a pair of discharge electrodes. The discharge electrodes are therefore exposed to a high thermal load as a result of the discharge. Since high density and high temperature plasma forms in the vicinity of the discharge electrodes, the discharge electrodes are also exposed to a thermal load of this plasma.

The discharge electrodes are gradually worn off by this thermal load, by which metallic debris forms. In the case of using an EUV radiation source device as the radiation source device of an exposure tool, EUV radiation which is emitted by the high density and high temperature plasma is focused by means of EUV collector optics and this focused EUV radiation is emitted to the side of the exposure tool. The metallic debris damages the EUV collector optics and adversely affects the EUV radiation reflection factor of the EUV collector optics.

The gradual wearing off of the discharge electrodes furthermore changes the shape of the discharge electrodes. Because of this, the discharge which forms between the discharge electrodes gradually becomes unstable. As a result, also the generation of the EUV radiation becomes unstable. This means that the lifetime of the discharge electrodes, in the case of using an EUV radiation source device of the DPP type as the radiation source of a semiconductor exposure tool of the mass production type, must be extended as much as possible.

To meet this need, in the publication "EUV sources using Xe and Sn discharge plasmas "J. Phys.D. Appl. Phys. 37 (2004) 3254-3265 (hereafter, Publication 2), an EUV radiation source device of the DPP type with discharge electrodes with a long lifetime which reacts accordingly to the above described circumstances is suggested. FIG. 5 shows a radiation source device as is described in Publication 2.

The EUV radiation source device shown in FIG. 5 has a chamber 1 as the discharge vessel in which there are a discharge part 2 as means for heating and excitation which heats and excites the EUV radiating fuel, and an EUV collector part 3 with EUV collector optics 3a which focuses the EUV radiation which is emitted by the high density and high temperature plasma which has been produced by heating and excitation of the EUV radiating fuel by the discharge part 2.

The EUV collector part 3 focuses the EUV radiation and guides it from an EUV radiation extracting part 4 located in the chamber 1 into the irradiation optical systems of an exposure tool which is not shown in the drawings. The chamber 1 is connected to a pumping device 5. The interior of the chamber 1 is subjected to a decompression atmosphere by this pumping device.

(a) Discharge Part

The discharge part 2 has an arrangement in which a first discharge electrode 2a of a metallic disk-like component and a second discharge electrode 2b likewise of a metallic disk-like component are arranged such that an insulating material 2c is clamped by them. The middle of the first discharge electrode 2a and the middle of the second discharge electrode 2b are arranged essentially coaxially. The first discharge electrode 2a and the second discharge electrode 2b are attached in a position which is apart by the thickness of the insulating material 2c. In this connection the diameter of the second discharge electrode 2b is greater than the diameter of the first discharge electrode 2a. Furthermore the thickness of the insulating material 2c, i.e. the distance between the first discharge electrode 2a and the second discharge electrode 2b, is roughly 1 mm to 10 mm.

The second discharge electrode 2b is provided with the rotating shaft 6a of a motor 6. In this connection, the rotating shaft 6a is mounted essentially in the middle of the second discharge electrode 2b such that the middle of the first discharge electrode 2a and the middle of the second discharge electrode 2b are located essentially coaxially on the axis of rotation. The rotating shaft 6a is for example routed via a mechanical seal 6b into the chamber 1 which allows rotation of the rotating shaft 6a while maintaining a decompression atmosphere within the chamber.

On the bottom of the second discharge electrode 2b, a first sliding contact 7a and a second sliding contact 7b, for example, of carbon brushes or the like, are mounted. The second sliding contact 7b is electrically connected to the second discharge electrode 2b. On the other hand, the first sliding contact 7a is electrically connected to the first discharge electrode 2a via a through opening 2e which penetrates the second discharge electrode 2b. An insulating arrangement (not shown) prevents formation of an insulation breakdown between the first sliding contact 7a which is electrically connected to the first discharge electrode 2a, and the second discharge electrode 2b.

The first sliding contact 7a and the second sliding contact 7b are electrical contacts which, during sliding, still maintain electrical connections and they are connected to a pulsed power generator 7 which supplies pulsed power via the first sliding contact 7a and the second sliding contact 7b between the first discharge electrode 2a and the second discharge electrode 2b.

This means that, when the first discharge electrode 2a and the second discharge electrode 2b are rotated by the motor 6, pulsed power from the pulsed power generator 7 is applied between the first discharge electrode 2a and the second discharge electrode 2b via the first sliding contact 7a and the second sliding contact 7b.

The pulsed power generator 7 applies a pulsed power with a short pulse width via a magnetic pulse compression (MPC) circuit part of a capacitor C and a magnetic switch SR between the first discharge electrode 2a and the second discharge electrode 2b which constitute a load. Line routing from the pulsed power generator 7 to the first sliding contact 7a and to the second sliding contact 7b takes place also via an insulating current feed terminal (not shown), which is installed in the chamber 1 and which, while maintaining the decompression atmosphere within the chamber 1, enables electrical connections of the pulsed power generator to the first sliding contact 7a and the second sliding contact 7b.

The peripheral areas of the first discharge electrode 2a and the second discharge electrode 2b of metallic disk-like components are made edge-shaped. As is described below, between the edge-shaped regions of the two electrodes, a discharge forms when power is applied by the pulse power generator 7 to the first discharge electrode 2a and the second discharge electrode 2b. When the discharge forms, the vicinity of the electrodes reaches a high temperature. The first discharge electrode 2a and the second discharge electrode 2b therefore are made of a metal with a high melting point, such as, for example, tungsten, molybdenum, tantalum or the like.

The insulating material 2c is, for example, silicon nitride, aluminum nitride, diamond, or the like. In the peripheral area of the second discharge electrode, there is a groove area 2d which also reaches a high temperature when the discharge forms.

Solid Sn or solid Li, which is the fuel for the high temperature plasma, is supplied to the discharge part 2. The fuel can be supplied as solid Sn or solid Li that has been attached beforehand to the groove area 2d or also by the fuel supply unit 8.

The motor 6 turns only in one direction. By operating the motor 6, the rotating shaft 6a turns, and the second discharge electrode 2b and the first discharge electrode 2a which are mounted in the rotating shaft 6 turn in one direction.

The Sn or Li, which has been attached in the groove area 2d of the second discharge electrode 2b or which has been supplied to it is moved by rotation of the second discharge electrode 2b to the exit side of the SUV radiation in the discharge part 2.

On the other hand, in the chamber 1, there is a laser irradiation apparatus 9 which irradiates the Sn or Li which has been moved toward the side of the above described EUV collector part with a laser. The laser is a YAG laser or carbon dioxide gas laser or the like.

The laser of the laser irradiation apparatus 9 is emitted via a chamber window (not shown), which is located in the chamber 1, and a laser focusing means onto the Sn or Li which has moved toward the side of the above described EUV collector part, as focusing radiation.

As was described above, the diameter of the second discharge electrode 2b is greater than the diameter of the first discharge electrode 2a. The laser can therefore be easily aligned such that it passes through the side of the first discharge electrode 2a and irradiates the groove area 2d of the second discharge electrode 2b.

The emission of the EUV radiation from the discharge part 2 takes place as follows:

The laser is emitted from the laser irradiation apparatus 9 onto the Sn or Li of the groove area 2. The Sn or Li irradiated with the laser vaporizes between the first discharge electrode 2a and the second discharge electrode 2b, part thereof being ionized.

If, in this state, between the first and second discharge electrodes 2a, 2b, a pulsed power with a voltage between roughly +20 kV to −20 kV is applied by the pulse power generator 7, a discharge arises between the edge-shaped areas which are provided in the peripheral areas of the first discharge electrode 2a and the second discharge electrode 2b. In this connection, a pulse-like heavy current flows in the partially ionized part of the Sn or Li which is vaporized between the first discharge electrode 2a and the second discharge electrode 2b. Afterwards, a high density and high temperature plasma is formed by vaporized Sn or vaporized Li by Joulean heating by the pinch effect in the peripheral area between the two electrodes. This high density and high temperature plasma emits EUV radiation.

Since, between the first and the second discharge electrodes 2a, 2b, a pulsed power is applied as was described above, the discharge becomes a pulsed discharge. The emitted EUV radiation becomes pulsed radiation which is emitted in a pulse-like manner.

(b) EUV Radiation Collector Part

The EUV radiation emitted by the discharge part 2 is focused by means of the EUV collector optics 3a of the oblique incidence type which is located in the EUV radiation collector part 3 and is delivered to the irradiation optical system of an exposure tool which is not shown in the drawings by the EUV radiation extracting part 4 located in the chamber 1.

The EUV collector optics 3a has several mirrors which are formed, for example, in the shape of an ellipsoid of rotation with different diameters or in the form of a paraboloid of rotation with different diameters. These mirrors are arranged coaxially such that the center axes of the rotation come to rest on one another so that the focal positions essentially agree. These mirrors can advantageously reflect EUV radiation with an oblique angle of incidence from 0° to 25° by, for example, the reflection surface of the substrate material having a smooth surface of nickel (Ni) or the like, or being densely coated with a metallic layer of ruthenium (Ru), molybdenum (Mo) or rhodium (Rh).

(c) Debris Trap

Furthermore, there is a debris trap 10 between the above described discharge part 2 and the EUV radiation collector part 3 to prevent damage to the EUV collector optics 3a. The debris trap 10 mitigates and catches debris, such as metallic powder/particles or the like, which are produced by the high density and high temperature plasma by sputtering of the peripheral areas of the first and second discharge electrodes 2a, 2b which are in contact with the high density and high temperature plasma, debris as a result of Sn or Li as radiating fuel and the like and passes only EUV radiation.

In the EUV radiation source device of the DPP type shown in FIG. 5, the debris trap 10 is comprised of a gas curtain 12 and a foil trap 11. The gas curtain 12 is formed by gas which is supplied to the chamber 1 via a nozzle from a gas supply unit 14.

FIGS. 6(a) and 6(b) each schematically show the gas curtain device. As is shown in FIG. 6(a), a nozzle 14a has the shape of a rectangular parallelepiped and its opening from which gas is emitted has a narrow rectangular shape. When gas is supplied from the gas supply unit 14 of the nozzle 14a, gas is emitted sheet-like from the opening of the nozzle 14a, by which a gas curtain is formed. The gas curtain 12 changes the feed direction of the above described debris and restrains its reaching the EUV collector optics 3a (shown downstream of gas supply unit 14 in FIG. 1). The gas used in this connection for the gas curtain is preferably gas with a high transmittance to EUV radiation such as, for example, one of the rare gases, such as helium, argon or the like, and also hydrogen or the like.

FIG. 6(b) shows a diffuser 14b for drawing in the above described gas; it is located opposite the above described nozzle 14b and intakes the gas emitted from the nozzle.

Furthermore, between the gas curtain 12 and the EUV collector optics 3a, there is the foil trap 11 which is called such in published patent application JP-OS 2004-214656 (U.S. Patent Application Publication 2004-0184014 A 1) (hereafter, Patent Document 1). The foil trap 11 is comprised of several plates which are arranged in the radial direction of the area in which the high density and high temperature plasma has formed, such that the EUV radiation emitted by the high density and high temperature plasma is not screened, and of a ring-like support body which supports these plates, and is mounted on a partition 13 of the foil trap. By placing such a foil trap 11 between the gas curtain 12 and the EUV collector optics 3a, the pressure between the high density and high temperature plasma and the foil trap 11 increases, raising the gas density of the gas curtain 12 present at this location and thus collisions between the gas atoms and the debris increase. By repeated collisions, the debris reduces its kinetic energy, by which the energy decreases in the collisions of the debris with the EUV collector optics 3a. This makes it possible to reduce damage to the EUV collector optics 3a.

By the above described EUV radiation source device of the DPP type, the position changes for the two electrodes 2a, 2b on which a pulse discharge arises for each pulse, since the first discharge electrode 2a and the second discharge electrode 2b rotate. The thermal load to which the first discharge electrode 2a and the second discharge electrode 2b are subject is therefore reduced, by which the rate of wear of the discharge electrodes is reduced. Thus, a lengthening of the lifetime of the discharge electrodes 2a, 2b is enabled.

FIG. 5 shows the discharge part 2 as if it were larger than the EUV radiation collector part 3, but it is shown as such only for simplification of understanding. The actual size ratios therefore do not correspond to FIG. 5.

As was described above, in the formation of EUV radiation, a pulsed power with a voltage of roughly +20 kV to −20 kV is applied between the first and second discharge electrodes 2a, 2b. On the other hand, the distance between the first and second discharge electrodes 2a and 2b is roughly 1 mm to 10 mm, for example, 5 mm. The peripheral areas of the first and second discharge electrodes 2a, 2b are formed in the shape of edges, and the electrical field is concentrated in the edge-shaped areas.

Therefore, the pressure in the discharge part 2 in a decompression atmosphere must be kept, for example, at a few Pa or less than or equal to this value. Otherwise, in the second discharge electrode 2a also outside the vicinity of the area which is irradiated with a laser by the laser irradiation apparatus 9 a discharge forms between the edge-shaped areas which are provided in the peripheral areas of the first and second discharge electrodes 2a, 2b.

The state in which a discharge forms outside the vicinity of the laser-irradiated area leads to an increase of the thermal load on the electrodes. The rate of wear of the discharge electrodes 2a, 2b is not reduced. Furthermore, the discharge becomes unstable in the vicinity of the laser-irradiated area, by which the EUV output also becomes unstable.

On the other hand, on the debris trap 10 located between the discharge part 2 and the EUV radiation collector part 3, for example, of the gas curtain 12 and foil trap 1, the kinetic energy of the debris cannot diminish if the pressure is not somewhat high. The effect exerted on the EUV collector optics 3a by the contamination cannot be suppressed. If an attempt is made to suppress the effect of the contaminants, the region in the radiation exit direction proceeding from the debris trap 10 (i.e., the area in which the debris trap 10 and EUV collector optics 3a are located) has altogether, for example, roughly a few hundred Pa.

This means that the area proceeding in the radiation exit direction in front of the debris trap 10 has roughly a few 100 Pa because in the EUV radiation source device of the DPP type shown in FIG. 5 for suppressing the effect of the contaminants a gas curtain 12 and a foil trap 11 are used as the debris trap 10. Then the pressure within the chamber 1 in the discharge part 2 exceeds a few Pa. When the pressure within the chamber 1 exceeds a few Pa, a discharge forms in unwanted regions of the first and second discharge electrodes 2a, 2b, as was described above. Therefore, it is necessary to carry out differential pumping such that the pressure in the discharge part 2 is subjected to a decompression atmosphere, for example, of a few Pa, and moreover, the area in which the debris trap 10 and the EUV collector optics 3a are located is subjected to a pressure atmosphere of a few 100 Pa.

For example, in published International Patent Application WO 2005/025280 A2 (hereafter, Patent Document 2), between the rotating discharge electrodes and the EUV collector optics, there are screens with openings, and thus, it is indicated that the pressure on the sides of the discharge electrodes is made into a lower pressure by the openings becoming pressure resistances.

FIG. 7 shows the arrangement of the EUV radiation source device described in Patent Document 2. FIG. 7 is a cross section of the EUV radiation source device shown in FIG. 1 of this publication. Disk-like electrodes 34, 36 rotate around an axis of rotation 46. Heated, liquid metal 47 is used as the fuel for the high density and high temperature plasma. The electrodes 34, 36 are partially immersed in it. The liquid metal 47 which is in contact with the surfaces of the electrodes 34, 36 is transported by rotation of the electrodes 34, 36 to a discharge part 45 with a given gap and is caused to vaporize by laser 48.

By application of a discharge voltage from the pulsed power generator 49 via the liquid metal 47 to the electrodes 34, 36, in the discharge part 45 a discharge is started, by which a high density and high temperature plasma is formed. The EUV radiation formed by the high density and high temperature plasma is extracted via the foil trap 50 toward the top of the drawing.

Furthermore, the screens 44 with openings on the exit side of the EUV radiation are arranged such that a space is surrounded by them contains the above described disk-shaped electrodes 34, 36 and a unit for supply of fuel 47 for the plasma. In Patent Document 2, it is indicated that the pressure on the sides of the discharge electrodes is made into a decompression by the openings of these screens becoming pressure resistances.

Assuming that, based on the suggestion described in Patent Document 2, in the device shown in FIG. 5, an effort is made to place screens with openings between the discharge part 2 and the debris trap 10, it is in fact difficult to fix the pressure in the discharge part 2 to a few Pa and to subject the region in which the debris trap 10 and the EUV collector optics 3a are located to a pressure atmosphere of roughly a few 100 Pa.

As was described above, in the discharge part 2, the discharge produces a high density and high temperature plasma which has such a high temperature that the first discharge electrode 2a and the second discharge electrode 2b of a material with a high melting point are worn off. It is therefore necessary to move the screens with the openings a certain amount (by a few cm) away from this high density and high temperature plasma.

On the other hand, the openings of the screens have regions through which the EUV radiation, which is emitted by the high density and high temperature plasma, passes. The size of the respective opening must be fixed at a value at which at least the EUV radiation which is incident in the EUV collector optics is not screened.

For example, if the openings of the screens which are moved a few cm away from the high density and high temperature plasma are set to a size at which the EUV radiation incident in the EUV collector optics is not screened, and if the distance between the discharge electrodes (i.e., the size of the resulting high density and high temperature plasma) is fixed, for example, at 5 mm, the respective opening reaches a size of roughly 10 cm. It is imagined that, for the openings with this size, the pressure in the discharge part 2 can be set to roughly a few Pa and for the region in which the debris trap 10 and the EUV collector optics 3a are located can be maintained at a pressure atmosphere of a few 100 Pa.

Under the above described pressure conditions, the gas located within the chamber is in a viscous flow state. Via the opening, the gas located on the debris trap 10 flows to the side of the discharge part 2. If the above described pressure conditions should prevail, it is therefore necessary to arrange a large pumping device with a large pumped amount at the side of the discharge part 2.

In the discharge part 2, laser yields vaporized Sn gas or vaporized Li gas. It is required of the pumping device to be placed in the discharge part 2 that pump treatment of this metal vapor can be carried out. This means that, on the side of the discharge part 2, a pumping device is required which has a large pumped amount and in which, moreover, pump treatment of the metal vapor is possible. This pumping device is large, costly and therefore not realistic.

On the other hand, metallic debris which forms when generating a high density and high temperature plasma by the discharge, and debris as a result of the EUV radiating fuel pass through the openings of the screens. Therefore, it is necessary, as shown in FIG. 6(a) & 6(b), to fix the gas curtain such that at least the overall openings are covered.

In the gas curtain device shown in FIGS. 6(a) & 6(b), the gas flows sheet-like in the vicinity of the openings. However, the flow becomes more of a turbulent flow the farther it is from the openings. Therefore, gas curtain loses its velocity in the center of the openings and flows onto the side of the discharge part when the gas supplied from the gas supply unit 14 does not have a somewhat high flow velocity. For this reason, in the openings, a region is formed in which there is hardly any gas curtain. The debris which has passed through this area damages the EUV collector optics 3a since the kinetic energy is not much reduced by the foil trap 11. As a result, the gas supply amount per unit of time from the gas supply unit 14 can be increased.

However, when the openings of the screens are roughly 10 cm, as was described above, it is in fact very difficult, even using a large pumping device, to maintain the pressure of one of the screens at a few Pa and the pressure of the other screen at a few 100 Pa, i.e., at this pressure difference. Therefore, a pressure difference between the two sides of the screens cannot be formed. If a pressure difference cannot be formed, a gas curtain cannot be used as a debris trap since, by using a gas curtain, the pressure in the discharge part increases, and thus, a discharge forms in unwanted regions of the first and second discharge electrodes.

SUMMARY OF THE INVENTION

The invention was devised to eliminate the aforementioned disadvantages in the prior art. In particular, a primary object of the present invention is to devise an EUV radiation source device in which the pumping device located on the side of the discharge part and the debris trap located on the side of the EUV collector optics are not made large and in which simple adjustment of the desired pressure difference between the side of the discharge part and the side of the EUV collector optics is possible.

The above described object is achieved in accordance with the invention in that a chamber is divided into a region provided with electrodes and a region provided with collector optics, that between the pair of electrodes comprising the discharge part and the collector optics, there is an aperture component with an opening and that there is a device for cooling this aperture component.

By the above described arrangement of the aperture component between the pair of electrodes comprising the discharge part, and the collector optics, and by cooling this aperture component, the aperture component can be placed in the vicinity of the pair of electrodes, i.e., in the vicinity of the high density and high temperature plasma. The EUV radiation incident in the EUV collector optics is therefore not screened even if the diameter of the opening of the aperture component is reduced.

If the diameter of the opening of the above described aperture can be reduced, maintaining the pressure difference between the region provided with the electrodes and the region provided with the collector optics at a few 100 Pa is relatively simple. The pumping device located on the side of the discharge part and also the debris trap located on the side of the EUV collector optics are not made large.

As was described above, the above described object is achieved in accordance with the invention as follows:

(1) In an EUV radiation source device which comprises:
a vessel;
a pair of discharge electrodes which are located in the above described vessel and in which two disk-like electrodes are located a certain distance apart from one another;
a fuel supply means for supplying liquid or solid material which emits EUV radiation to at least one of the above described discharge electrodes;
a discharge electrode rotation arrangement for rotating at least one discharge electrode on the side to which the above described fuel is supplied;
a vaporization means for vaporizing the fuel supplied to the above described discharge electrode;
a power supply means for supplying power between the electrodes; and
collector optics for focusing EUV radiation which is emitted from a high density and high temperature plasma which is produced by the vaporized fuel being heated and excited by a discharge which forms between the electrodes;
an aperture component with an opening located in the vessel between the electrodes and the collector optics, the vessel being divided into a region provided with electrodes and a region provided with collector optics;
a device for cooling the aperture component; and
a pumping means provided for at least the region provided with the electrodes.

(2) In the device (1), the distance from the electrode on the high voltage side of the above described pair of electrodes to the aperture component is at least the distance between the above described pair of discharge electrodes.

(3) In the device (1) having characteristic (2), for the above described pair of discharge electrodes, two disk-like electrodes are made integral by an essentially concentric arrangement at a certain distance to one another, and the above described discharge electrode rotating arrangement turns the integral pair of discharge electrodes.

(4) In the device (1) with features (2) & (3), the aperture component has a means which allows a coolant to circulate and cools it.

(5) In the device (1) with features (2) to (4), the above described aperture component is made of a metal with a high melting point and a metal with a good heat conducting property with easier workability than the metal with a high melting point.

(6) In the device (1) with features (2) to (5), the opening formed in the above described aperture component is made in the form of a knife edge that is inclined toward the radiation exit side.

(7) In the device (1) with features (2) to (6), the radiation exit side of the above described aperture component is provided with means which allows gas to flow sheet-like at high speed transversely over the opening of the aperture component.

(8) In the device (1) with features (2) to (7), there is a gas intake means for drawing in this gas opposite the above described means which allows the gas to flow.

(9) In the device (1) with features (2) to (8), the above described power supply means is made such that it is operated after operation of the above described device for cooling the aperture.

Action of the Invention

In accordance with the invention, the following effects are obtained:

(1) By arranging the aperture component between the pair of electrodes comprising the discharge part, and the collector optics, and by an arrangement such that this aperture component is cooled, the aperture component can be placed in the vicinity of the pair of electrodes and the diameter of the opening of the aperture can be reduced. Therefore, it becomes easier to maintain the pressure difference between the region provided with the electrodes and the region provided with the collector optics at a few 100 Pa. Furthermore, the pumping device and the debris trap are prevented from having to be large.

(2) Because the distance from the electrode to which the discharge voltage is applied to the aperture component is fixed at the distance between the discharge electrodes or to a somewhat greater distance than this distance, even in an arrangement of a metal aperture component a discharge is avoided between the aperture component and the electrode to which the discharge voltage is applied.

(3) By arranging the aperture component of a metal with a high melting point and a metal with a good heat conducting property with easier workability than the metal with a high melting point, machining is simplified and product costs can be reduced.

(4) By arranging the opening formed in the aperture component in the form of a knife edge that is inclined toward the radiation exit side, the scattering of the EUV radiation at the opening can be reduced and the scattered radiation can be prevented from reaching an unwanted location in the vessel.

(5) By arranging the means which allows gas to flow sheet-like at high speed transversely via the opening of the aperture component on the radiation exit side of the aperture component, debris can be prevented from reaching the collector optics.

Furthermore, a gas intake means can be arranged opposite the gas flow means and in this way the above described gas can be quickly taken in. The effect of this gas on the pressure of the region provided with electrodes and the region provided with the collector optics is also reduced. Since in accordance with the invention especially the opening of the aperture can be made smaller, the distance between the above described gas flow means and gas intake means can be reduced. Therefore, the gas flow in the gas curtain can be kept in the state of a sheet flow, by which diffusion of this gas into the vicinity is also reduced. As a result, the effect of this gas on the ambient pressure can be reduced even more.

(6) The formation of a high density and high pressure plasma and aperture damage when the aperture is not being cooled can be prevented by the arrangement in which, after operation of the above described device for cooling the aperture, the above described power supply means is operated.

The invention is further described below with reference to the drawings.

BRIEF DESCRIPTION OF THE DRAWINGS

FIG. 2(a) is a schematic sectional view of the arrangement of the aperture;

FIG. 2(b) shows a schematic of the cross sectional arrangement of the aperture and of the installation of a cooling tube;

FIG. 2(c) shows a schematic of the installation of a cooling tube at right angles to the view of FIG. 2(b);

DETAILED DESCRIPTION OF THE INVENTION

Figure 1:
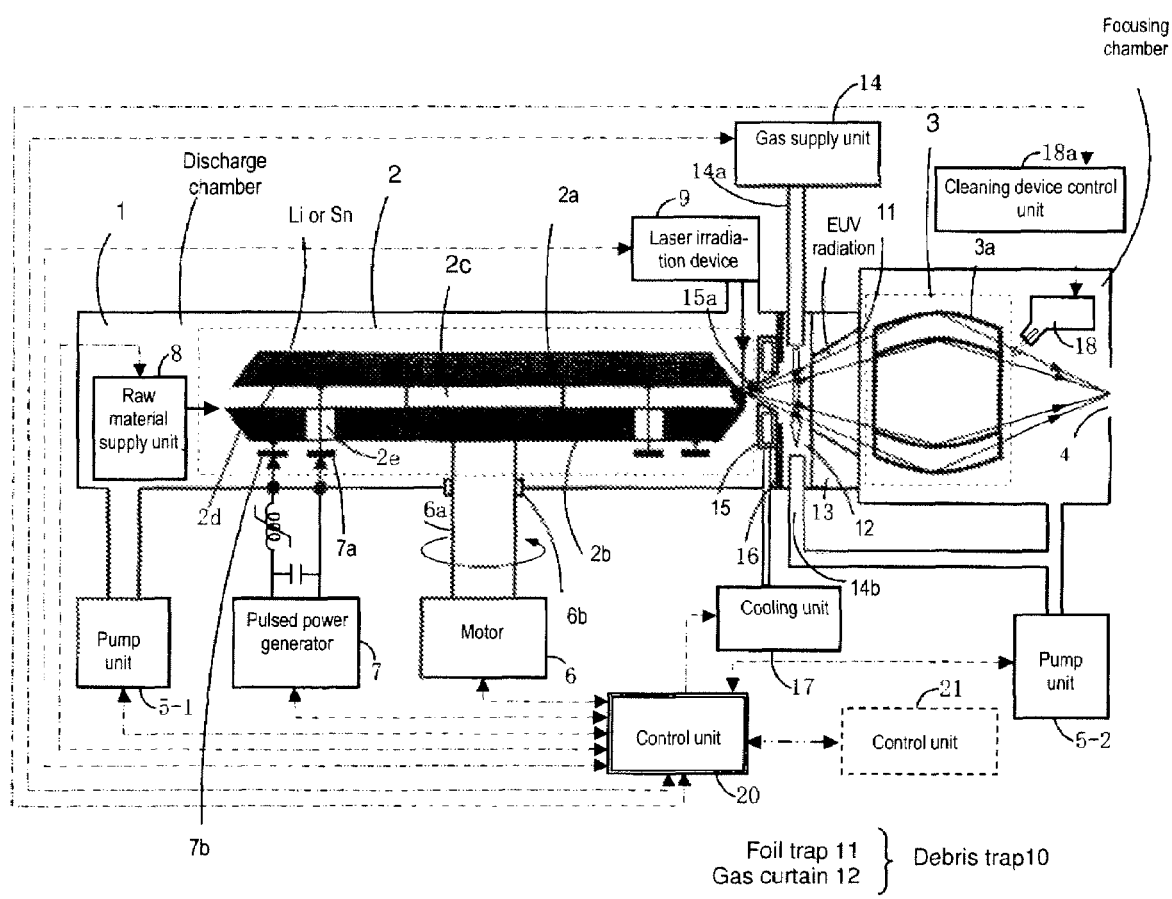
FIG. 1 is a schematic view of the arrangement of one embodiment of an EUV radiation source device of the DPP type in accordance with the invention.

FIG. 1 shows the arrangement of one embodiment of an EUV radiation source device of the DPP type in accordance with the invention. In the radiation source device of the DPP type in accordance with the invention, the chamber 1 is divided via a partition 16 with an opening essentially into two spaces. That is, in one of the spaces, a discharge part 2 is positioned, while in the other space, an EUV radiation collector part 3 and a debris trap 10 (formed of foil trap 11 and gas curtain 12) are positioned, as is shown in FIG. 1. FIG. 1 shows a case in which an aperture component 15 with an opening 15a is attached to the partition 16. A coolant is supplied to the aperture part 15 from a cooling unit 17, by which the aperture component 15 is cooled.

Figure 6A:
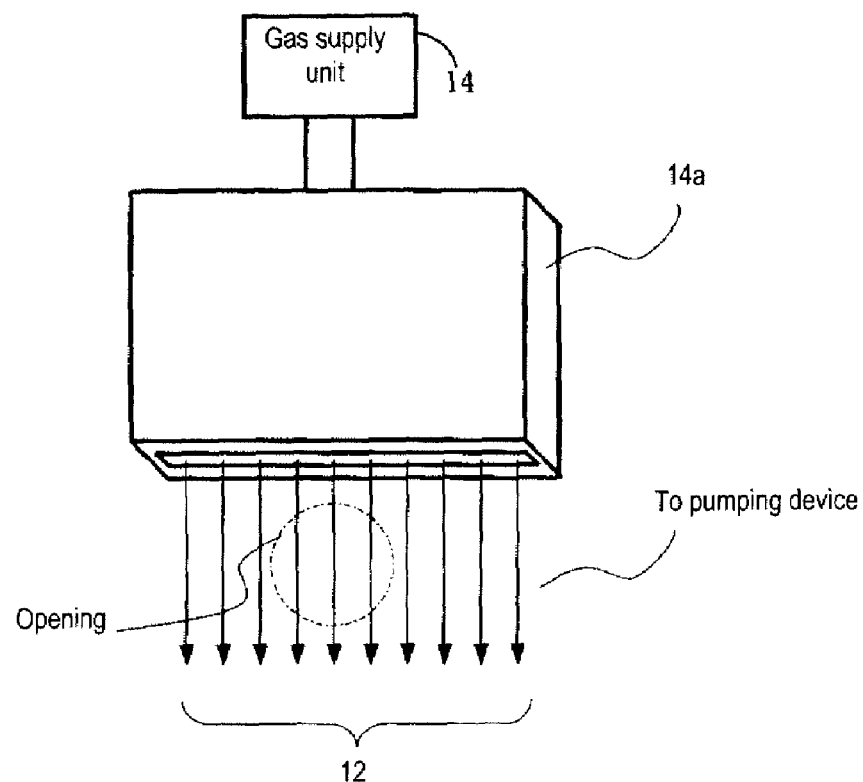
FIGS. 6(a) & 6(b) each show a schematic of the gas curtain device.
Figure 6B:
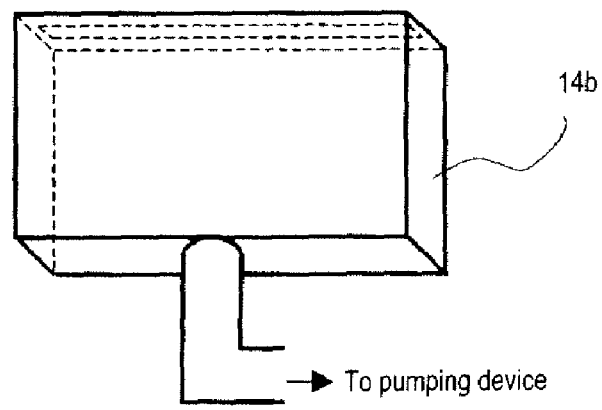

FIG. 1 also shows the partition 16 and the aperture component 15 as separate bodies. However, by forming the aperture in the partition 16, the partition 16 can be used as the aperture component. In this embodiment, the debris trap 10 is comprised of the gas curtain 12 and the foil trap 11. The gas curtain 12, as was shown in FIGS. 6(a) & 6(b), is formed by gas which is supplied in a sheet-like manner, which is supplied from a gas supply unit 14, and which is delivered from a nozzle 14a in the form of a rectangular parallelepiped. In this embodiment, there is also, as shown in FIG. 6(b), a means 14b (hereinafter called a diffuser) for taking in the gas of the gas curtain 12 opposite the nozzle 14a. The gas delivered by the nozzle 14a flows transversely via the opening 15a of the aperture component in a sheet-like manner and at high speed and is taken in by the above described diffuser 14b.

In the above described first space, the first pumping device 5-1 is coupled, and in the other space, a second pumping device 5-2 is coupled. The above described diffuser 14b is coupled to the second pumping device 5-2. The gas taken in by the diffuser 14b is pumped by the second pumping device 5-2. The space in which the discharge part 2 is located is hereinafter called the discharge space and the space in which the EUV radiation collector part 3 is located is hereinafter called the collector mirror space.

Figure 5:
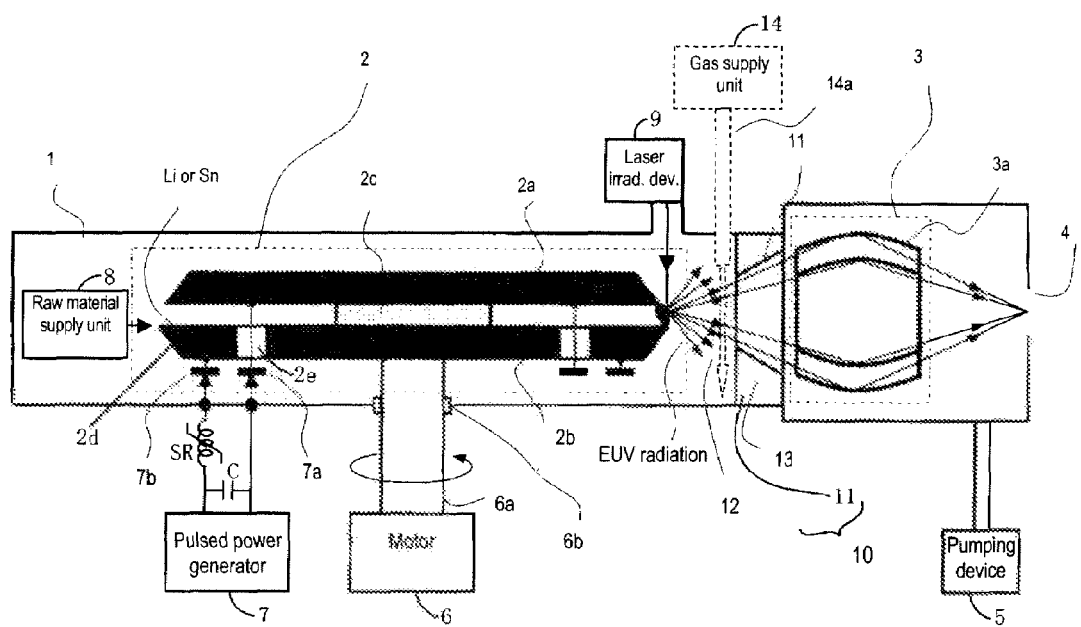
FIG. 5 shows a schematic of the arrangement of a conventional EUV radiation source device.

The remaining arrangement is fundamentally identical to the arrangement shown above using FIG. 5. In the discharge space, within the chamber 1, the first discharge electrode 2a and the second discharge electrode 2b which are of a metallic, disk-shaped components are arranged such that the insulating material 2c is clamped thereby. The diameter of the second discharge electrode 2b is greater than the diameter of the first discharge electrode 2a and its peripheral area is made edge-shaped. The rotating shaft 6a of a motor 6 is attached to the second discharge electrode 2b. On the bottom of the second discharge electrode 2b, there are a first sliding contact 7a and a second sliding contact 7b which are formed, for example, of carbon brushes or the like. Pulsed power is supplied between the first discharge electrode 2a and the second discharge electrode 2b from a pulsed power generator 7 via the first sliding contact 7a and the second sliding contact 7b.

In the peripheral area of the second discharge electrode 2b, there is a groove area 2d to which solid Sn or solid Li is supplied from a fuel supply unit 8 as the fuel for the high temperature plasma. Furthermore, in the case of using the fuel supply unit 8, for example, as is described in Patent Document 2, the fuel supply unit can have an arrangement in which Sn or Li is liquefied by heating as the fuel and in which the groove region 2d of the second discharge electrode 2b passes through this liquefied fuel. In this case, in the EUV radiation source device, the fuel supply unit is located on the bottom and the EUV radiation extraction part is located on the top. This means that the EUV radiation source device shown in FIG. 1 has an arrangement which is rotated 90° counterclockwise from that shown. Alternatively, the fuel supply unit 8 can be arranged such that solid Sn or solid Li is periodically supplied to the groove area 2d of the second discharge electrode 2b.

When the motor 6 turns, the second discharge electrode 2b and the first discharge electrode 2a turn in one direction, by which Sn or Li which was located in the groove area of the second discharge electrode 2b or was supplied to it moves toward the EUV radiation collector part.

The Sn or Li which has moved toward the EUV collector part is irradiated with laser from a laser irradiation apparatus 9 as the focusing light. In this state, when a pulsed power with a voltage of roughly +20 kV to −20 kV from the pulsed power generator 7 is applied between the first and second discharge electrodes 2a, 2b, a discharge forms between the edge-shaped areas in the peripheral regions of the first discharge electrode 2a and the second discharge electrode 2b. In the peripheral area between the two electrodes, a high density and high pressure plasma, is formed by vaporized Sn or vaporized Li from which EUV radiation with a wavelength of 13.5 nm is emitted, as was described above.

The second discharge electrode 2b must rotate in order to move the Sn or Li which was located in the groove area 2d of the second discharge electrode 2b or which was supplied to it. The first discharge electrode 2a however need not always be rotated, if there is only little wear as a result of the discharge.

The EUV radiation, emitted by the discharge part 2 is incident via an opening 15a of the above described aperture component 15 and the debris trap 10 in the EUV radiation collector part 3, is focused by means of an EUV collector optics 3a of the oblique incidence type which is located in the EUV radiation collector part 3, and is guided from the EUV radiation extraction part 4 located in the chamber 1 into the irradiation optical system of an exposure tool (not shown). The debris trap 10, formed of gas curtain 12 and foil trap 11, is located between the discharge part 2 and the EUV radiation collector part 3 to prevent damage of the EUV collector optics 3a.

The gas curtain 12, as was described above, changes the flow direction of the debris and prevents it from reaching the EUV collector optics 3a. The foil trap 11 has the above described arrangement, is mounted on a partition 13 for a foil trap 11 and catches debris and the like.

In the case of using tin as the fuel, as is shown in FIG. 1, there are a cleaning device control unit 18a and a cleaning device 18 for producing hydrogen radicals in the chamber 1 in the vicinity of the EUV collector part 3. Furthermore, by producing hydrogen radicals from the cleaning device 18, tin and tin compounds which have penetrated into the EUV collector part 3 are converted into tin hydride with a high vapor pressure and can be pumped out from the EUV collector part 3.

FIG. 1 shows the above described motor 6, the first pumping device 5-1, the second pumping device 5-2, the pulsed power generator 7, the fuel supply unit 8, the laser irradiation apparatus 9, the gas supply unit 14, the cooling unit 17 and a control unit 20 for controlling the cleaning device control unit 18a. The control unit 20, as is described below, controls the above described apparatus based on commands of the control unit 21 of the exposure tool.

As was described above, the discharge space must be kept in a decompression atmosphere of, for example, a few Pa in order to avoid formation of an unwanted discharge also outside the vicinity of the laser-irradiated region, specifically in the region which has not been irradiated with a laser between the edge-shaped areas of the peripheral regions of the first and second discharge electrodes 2a, 2b.

On the other hand, since the kinetic energy of the debris in the collector mirror space must be reduced on the debris trap 10, a defined pressure must be maintained on the debris trap 10. In FIG. 1, gas delivered from the gas curtain 12 is allowed to flow and the defined pressure is maintained on the foil trap 11. In this way, the kinetic energy of the debris is reduced. The pressure in the collector mirror space must therefore be maintained at a few 100 Pa as a result, as described above.

In this way, in accordance with the invention, there is a partition 16 in the chamber 1 which is divided into a discharge space and a collector mirror space in order to reliably maintain different pressures between the two spaces, as was described above. This partition 16 is provided with an aperture component 15 with an opening 15a which spatially couples the two spaces to one another. Since the opening 15a acts as a pressure resistance, by pumping the respective space by means of the first pumping device 5-1 and the second pumping device 5-2 and with consideration of the gas flow rate from the gas curtain 12, the size of the opening 15a, the pump capacity of the respective pumping device and the like, the discharge space can be kept at a few Pa and the collector mirror space at a few 100 Pa in a suitable manner.

In FIG. 1, in the discharge space in which the discharge part 2 is located, there is a first pumping device 5-1 and in the collector mirror space in which the EUV radiation collector part 3 is located there is a second pumping device 5-2. However, with consideration of the gas flow rate from the gas curtain 12, the size of the opening 15a, the pump capacity of the first pumping device 5-1 located in the discharge space and the like, it is also possible in a suitable manner, without arranging the second pumping device 5-2 in the collector mirror space and only using the first pumping device 5-1 located in the discharge space, to keep the discharge space at a few Pa and the collector mirror space at a few 100 Pa.

Furthermore, only one of the pumping devices 5-1, 5-2 can be used, the pipeline can be branched and one pumping device can be connected to two spaces. With consideration of the pump capacity of the pumping device, the transport capacity of the respective branched pipeline which is connected to the respective space, and the like it is also suitably possible to keep the discharge space at a few Pa and the collector mirror space at a few 100 Pa.

In this connection, the aperture component 15 is made of a metal with a high melting point, such as, for example, tungsten, molybdenum, tantalum or the like. Within the aperture component 15, as is shown in the schematic cross section of FIG. 2(a) (cross section which was cut by the plane which passes through the center axis of the opening 15a), there is a cavity which is coupled to the cooling unit 17. In this cavity the coolant from the cooling unit 17 circulates. That is, heat exchange takes place in the cavity when the aperture component 15 is heated, between the coolant supplied from the cooling unit 17 and the heated region of the aperture. The coolant with a temperature which has risen as a result of the heat exchange moves to the cooling unit 17, where it undergoes heat exchange, by which its temperature drops. The coolant with a temperature which had dropped, is, in turn, supplied from the cooling unit 17 to the above described cavity.

Furthermore, instead of the arrangement of the inner cavity in the aperture component 15, a cooling pipe 15a, in which the coolant flows, can be cemented to the aperture component 15 at the radiation exit side, as shown in FIGS. 2(b) and 2(c). FIG. 2(b) is a cross section which has been cut by a plane which passes through the center axis of the opening 15a. FIG. 2(c) is a schematic in which the aperture component 15 is viewed from the radiation exit side.

Furthermore, the aperture component 15 can be composed from two or more types of components.

As is shown for example in FIG. 2(a), for the region in the vicinity of the aperture which is exposed to the high density and high pressure plasma, a metal with a high melting point, such as tungsten or the like, and for the other region, a metal with a good heat conducting property, such as copper or the like, and which is more easily workable than metal with a high melting point can be used. In the copper part, a cavity is formed in which the coolant flows such that the metal with the high melting point from which the aperture was formed is surrounded thereby. In this way, processing is simplified, and production costs can be reduced.

As was described above, the above described aperture component 15 is made of a metal with a high melting point and furthermore has a cooling device. It therefore becomes possible to approach the high density and high pressure plasma.

Figure 3:
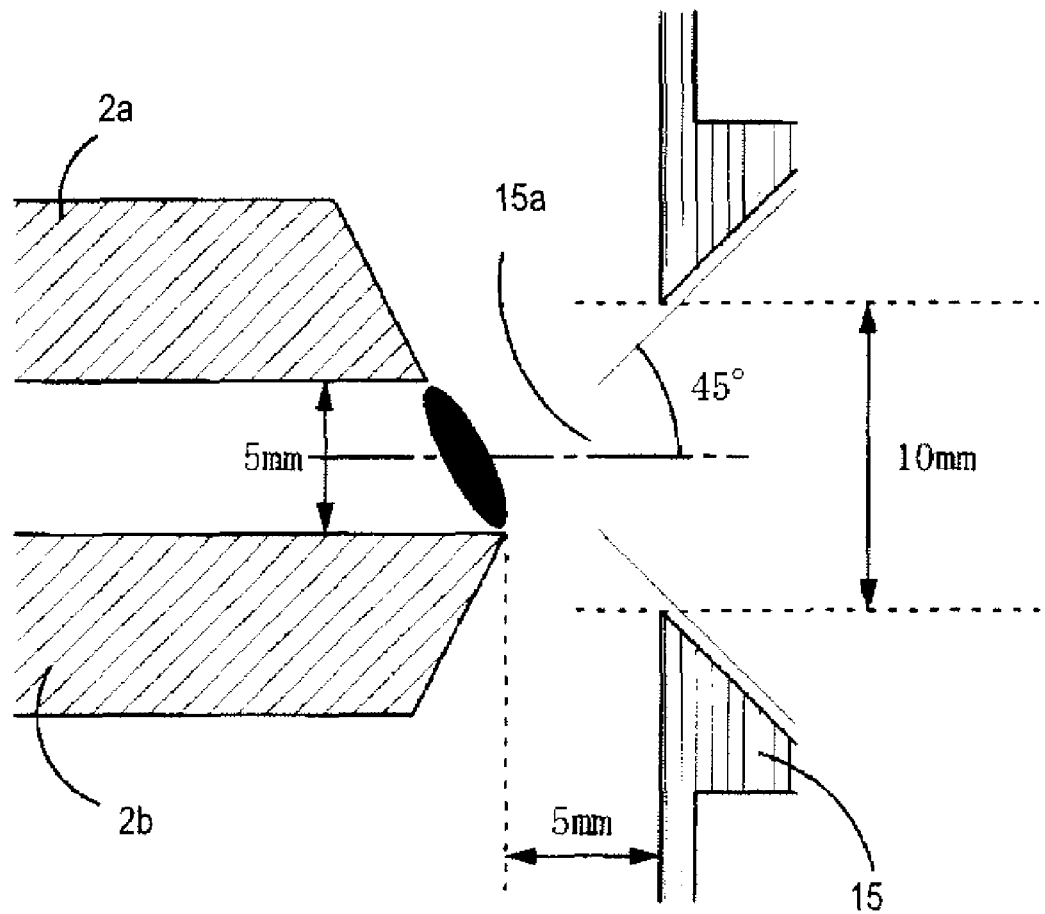
FIG. 3 is a schematic representation of the relation of the distance between the discharge electrode and the aperture and of the opening diameter of the aperture.

It is necessary to fix the size of the opening 15a located in the aperture component 15 at a size at which at least the EUV radiation incident in the EUV collector optics 3a is not screened. When the distance between the first discharge electrode 2a and the second discharge electrode 2b is, for example, 5 mm, it is possible for the opening 15a to approach the high density and high pressure plasma up to a distance of roughly 5 mm. Therefore, the radius of the opening 15a can be fixed at roughly 5 mm. If the EUV radiation is emitted with an angle of 45° and if the opening 15a approaches the high density and high pressure plasma up to a distance of roughly 5 mm, the radius of the opening 15a which does not screen the EUV radiation is roughly 5 mm, as is shown, for example, in FIG. 3.

If the aperture component 15 is metal, there is the possibility of a discharge between the electrodes and the aperture component when the aperture component 15 is caused to approach the discharge electrode even closer (electrode on the high voltage side, to which a voltage of roughly +20 kV to −20 kV is applied, for example, the second discharge electrode 2*b*). Therefore, it is desirable to fix the distance between the electrodes of the high voltage side, for example the second discharge electrode 2*b*, and the aperture component 15 at the distance between the discharge electrodes or a distance somewhat greater than this distance.

The opening 15*a* of the above described aperture component 15 is made in the form of a knife edge that is inclined toward the radiation exit side. This arrangement reduces the scattering of the EUV radiation on the opening 15*a*, by which it becomes possible to prevent the scattered radiation from reaching an unwanted region within the chamber.

The aperture component can also be produced from ceramic. When the aperture component is made of metal, it is possible for a discharge to form between the discharge electrodes and the aperture component. However, by producing the aperture component from ceramic, there is no longer any fear of a discharge between the discharge electrodes and the aperture component. On the other hand, the ceramic does not have heat conducting properties as good as metal so that effective cooling is difficult, so that damage due to overheating is possible when this aperture approaches the electrodes.

As was described above, the gas used for the gas curtain 12 is preferably a rare gas, such as helium, argon, hydrogen or the like. If the mean free path at a pressure of these gases of a few 100 Pa and the size of the above described opening 15*a* are compared to one another, the mean free path of the above described gases is much smaller. The gas within the chamber is located in a viscous flow state, and the gas on the debris trap side flows via the opening 15*a* into the discharge part.

As was described above, conventionally, based on the findings described in Patent Document 2 for maintaining the discharge space and the collector mirror space at the above described pressures, it has been suggested that the screens provided with openings be placed between the discharge space and the collector mirror space. However, the screens must be moved away from the high density and high pressure plasma to some extent. If the openings of the screens are fixed at a size at which the EUV radiation incident in the EUV collector optics is not screened, it would have to be set to a size of roughly 10 cm. In the case in which the conventional findings are used, it was therefore difficult by arrangement of a large pumping device with a large pumped quantity in reality to pump the gas flowing into the discharge space from the collector mirror space and to fix it at a few Pa.

Conversely, in accordance with the invention, since the size of the opening 15*a* can be reduced, as was described above, the pumped amount of the first pumping device 5-1 which is located on the side of the discharge part 2 can be reduced.

On the other hand, in the discharge part 2, metal vapor, such as vaporized Sn gas or vaporized Li gas is formed by laser irradiation, as was described above. Since, in accordance with the invention, the first pumping device 5-1 can be made smaller, the pumping device which can pump the metal vapor can also be made small and moreover at low cost.

Furthermore, because the opening 15*a* can be made smaller, it becomes possible to set it such that the gas curtain 12 easily covers the opening 15*a* completely. This means that, with the reduced size of the opening 15*a*, the width of the gas curtain 12 can also be reduced. The velocity of the gas from the gas curtain 12 is therefore increased without increasing the gas flow state from the gas supply unit 14. Therefore, the flow does not lose its velocity in the middle in the opening so that the kinetic energy of the contaminant can be reliably reduced by the gas curtain 12.

Since the gas flow of the gas curtain 12 does not lose its velocity, as was described above, there can be a diffuser 14*b* and the gas can be quickly taken in through the diffuser 14*b*, the pressure in the region in which the gas curtain is formed can be locally increased to a few kPa without the pressures of the collector mirror space of a few 100 Pa and of the discharge space of a few Pa being affected.

Since the pressure in the region in which the gas curtain is formed can be increased, the kinetic energy of the debris can be reduced even more and damage to the EUV collector optics 3*a* can be prevented. The debris trap 10 need not always be formed of two parts, specifically of the gas curtain 12 and the foil trap 11. For example, the foil trap alone can reduce the kinetic energy of the debris when the pressure of the collector mirror space is fixed at a few 100 Pa. However, the kinetic energy of the debris can also be effectively reduced by simultaneous use of the gas curtain and foil trap.

The gas curtain device need not always be located on the radiation exit side of the opening 15*a*, but can also be located, for example, on the radiation incidence side of the opening 15*a*. However, in the case of an arrangement of the gas curtain device on the radiation incidence side, the gas curtain device is opposite the high density and high pressure plasma. Therefore, it must be moved somewhat away from the high density and high pressure plasma. As a result, the opening is also moved away from the high density and high pressure plasma and is enlarged. Therefore, it advantageous to place the gas curtain device on the radiation exit side and such is preferred.

As was described above, the gas within the chamber 1 becomes a viscous flow. The gas curtain 12 which covers the opening 15*a* therefore passes through the opening 15*a* and flows from the collector mirror space to the discharge space.

In the invention, the opening 15*a* can be made smaller so that the flow velocity of the viscous flow which flows from the collector mirror space into the discharge space increases. The higher the velocity of the viscous flow which passes through the opening, the more difficult the passage of the debris through the opening becomes. The kinetic energy of the debris which has passed through the opening decreases with high efficiency.

FIG. 1 showed an example in which a single chamber was divided by a partition. However, this arrangement is not essential. For example, two chambers can also be coupled to one another, with the interior of one of the chambers being made the discharge space and the other chamber being made the collector mirror space, and either of the chambers can be provided with a partition which has an opening.

Figure 4:
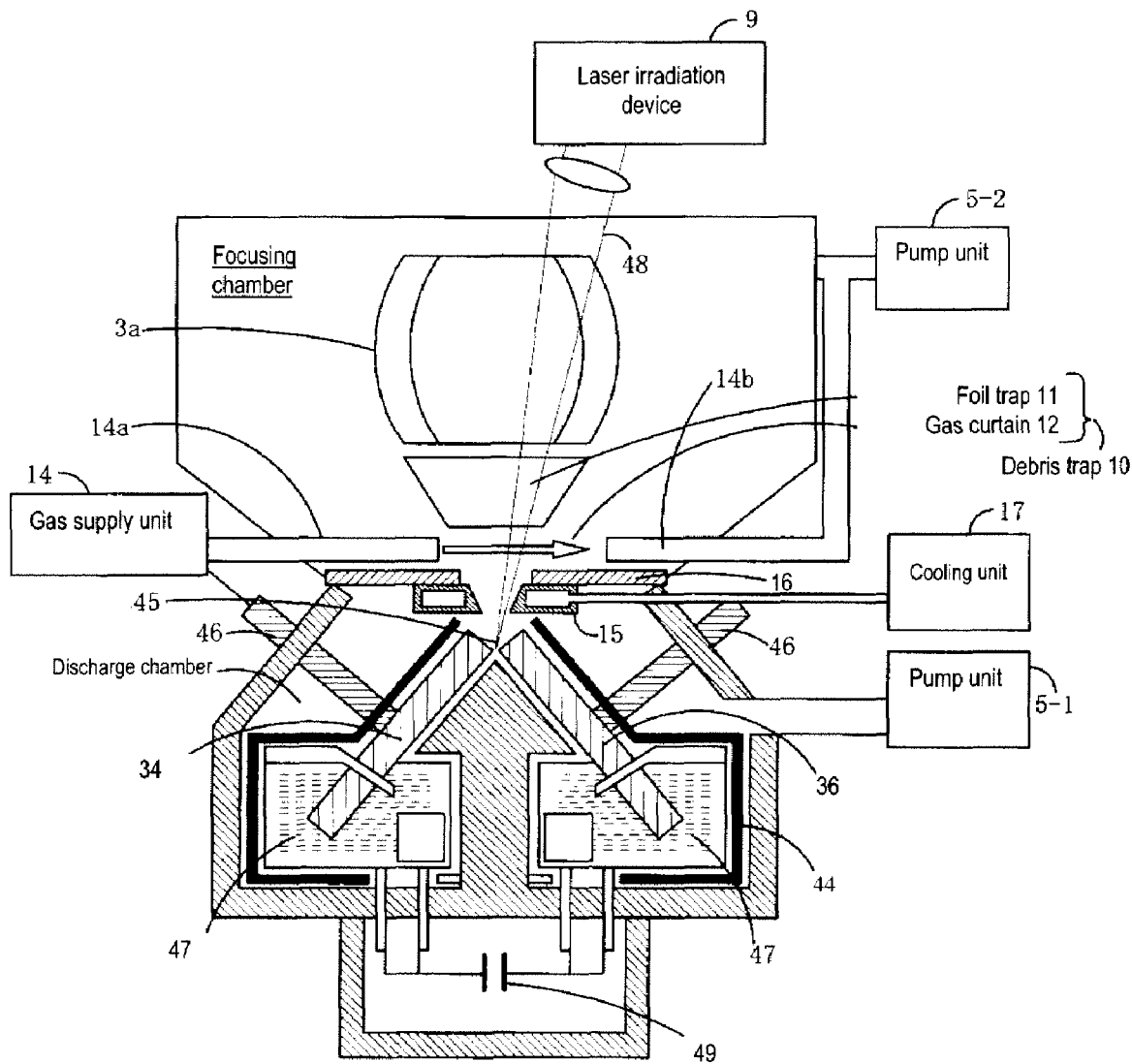
FIG. 4 is a schematic of the arrangement of one example of use of the invention in the EUV radiation source device in Patent Document 2.

The EUV radiation source device in accordance with the invention is furthermore not limited to the EUV radiation source device shown in FIG. 1, but can also have the arrangement shown, for example, in FIG. 4, in which the EUV radiation source device described in Patent Document 2 is provided with an aperture component which has a cooling device, and with a partition.

FIG. 4 shows the arrangement of one example of use of the invention for the EUV radiation source device described above with reference FIG. 7. In this connection, there are a partition 16 which performs division into a discharge space provided with discharge electrodes and in a collector mirror space provided with an EUV collector optics 3*a*, and an aperture 15.

Figure 7:
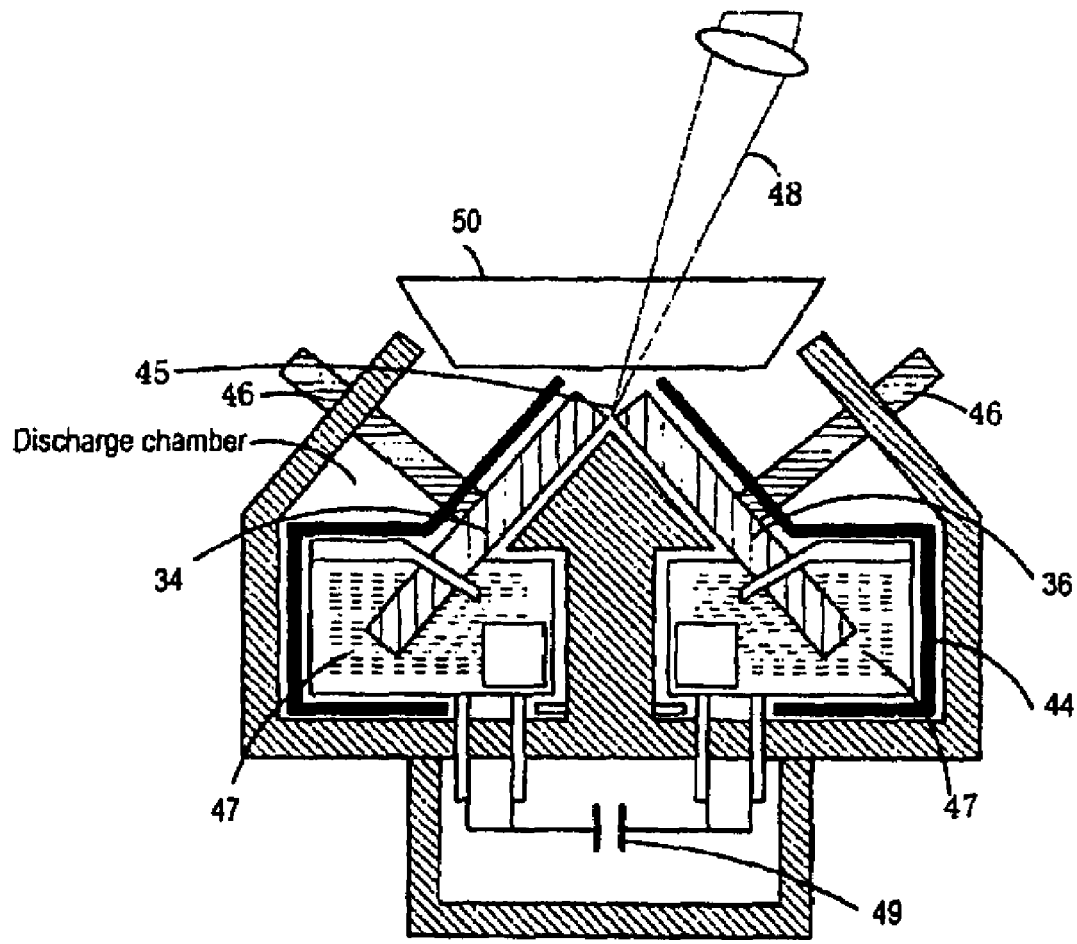
FIG. 7 shows a schematic of the arrangement of the EUV radiation source device described in Patent Document 2.

This means that, on the radiation exit side of the EUV radiation source device shown in FIG. 7, there is a partition 16 in which an aperture 15 provided with an opening is made and which is cooled by the cooling unit 17. Moreover, there is a debris trap 10 formed of a gas curtain 12 and a foil trap 11.

The gas curtain 12, as described above, is formed by a gas which flows in a sheet-shaped form, which is supplied by a gas supply unit 14 and which is delivered by a nozzle 14*a* which has the shape of a rectangular parallelepiped. Opposite the nozzle 14a is a diffuser 14b which takes in the gas of the gas curtain 12.

Furthermore, there are a first pumping device 5-1 and a second pumping device 5-2 for pumping the above described discharge space and the collector mirror space provided with the EUV collector optics 3a. The discharge space is kept at a few Pa and the collector mirror space at a few 100 Pa.

The sequence of operation of the EUV radiation source device in accordance with the invention is described using one example. In this connection, as shown in FIG. 1, a case of control of the first pumping device 5-1, the second pumping device 5-2, the pulsed power generator 7, the motor 6, the cooling unit 17, the laser irradiation apparatus 9, the gas supply unit 14 and the fuel supply unit 8 by the control unit 20 located in the EUV radiation source device is described below.

(1) A stand-by signal is sent to the control unit 20 of the EUV radiation source device from the control unit 21 of the exposure tool.

(2) The control unit 20 of the EUV radiation source device which has received the stand-by signal operates the first pumping device 5-1 and the second pumping device 5-2, controls the fuel supply unit 8 and starts liquefaction of the fuel.

(3) Next, the control unit 20 of the EUV radiation source device operates the gas supply unit 14, delivers gas from the nozzle 14a and forms the gas curtain 12.

(4) When the fuel is tin, a cleaning device 18 is operated by which hydrogen radicals are produced.

(5) The control unit 20 of the EUV radiation source device, based on the pressure data which are sent from pressure monitors (not shown) which are located in the discharge space and collector mirror space respectively, controls the first pumping device 5-1 and the second pumping device 5-2 such that the pressure of the discharge space and pressure of the collector mirror space are each set to a given pressure (for example, a few Pa in the discharge space and a few hundred 100 Pa in the collector mirror space), and thus, the amount of gas pumped is controlled.

(6) The control unit 20 of the EUV radiation source device controls the cooling unit 17 and allows the coolant to circulate in the cavity of the aperture component 15.

(7) Next, the control unit 20 of the EUV radiation source device operates the motor 6 and rotates the first discharge electrode 2a and the second discharge electrode 2b. But also only the second discharge electrode 2b which supplies the fuel can also rotate.

(8) The fuel supply unit 8 after completion of liquefaction of the fuel sends a fuel liquefaction termination signal to the control unit 20 of the EUV radiation source device.

(9) The control unit 20 of the EUV radiation source device which has received the fuel liquefaction termination signal sends a stand-by termination signal to the control unit 21 of the exposure tool.

(10) The control unit 21 of the exposure tool which has received the stand-by termination signal sends an EUV emission command signal to the control unit 20 of the EUV radiation source device.

(11) The control unit 21 of the EUV radiation source device which has received the EUV emission command signal operates the laser irradiation apparatus 9, irradiates the groove area 2d of the second discharge electrode 2b with a laser and moreover a trigger signal sends to the pulsed power generator 7. Sn or Li which have been irradiated with the laser vaporizes between the first discharge electrode 2a and the second discharge electrode 2b, part thereof being ionized.

(12) The pulsed power generator 7 which has received the trigger signal applies a pulsed power between the first discharge electrode 2a and the second discharge electrode 2b.

A discharge forms between the edge-shaped regions which are provided in the peripheral areas of the first discharge electrode 2a and the second discharge electrode 2b. In this connection in the partially ionized portion of Sn or Li which has vaporized between the first discharge electrode 2a and the second discharge electrode 2b a pulse-like heavy current flows. Afterwards a high density and high temperature plasma is formed by vaporized Sn or vaporized Li by Joulean heating by the pinch effect in the peripheral area between the two electrodes. This high density and high temperature plasma emits EUV radiation with a wavelength of 13.5 nm.

(13) The emitted EUV radiation passes through the opening 15a, the gas curtain 12 and the foil trap 11, is incident in the EUV collector optics 3a, is then reflected, focused and emerges from the EUV radiation extracting part 4 to an irradiation part which constitutes an optical system on the side of the exposure tool (not shown).

(14) Afterwards, depending on the exposure specification, the emission of the pulse-like EUV radiation is repeated until an EUV emission stop signal (corresponds to the EUV radiation source end signal when exposure is completed and an EUV radiation pause signal when exposure stops temporarily) is input from the control unit 21 of the exposure tool to the control unit 20 of the EUV radiation source device.

The process of stopping the EUV radiation source device when the EUV radiation stop signal is input to the control unit 20 of the EUV radiation source device (stopping of the pulsed power, of gas supply, pumping of the chamber, of the motor and the like) is not described here.

One example of automation by the control unit 20 was described above; however, the invention is not limited thereto. The operator can, for example, also operate the first pumping device, the second pumping device, the pulsed power generator, the motor, the cooling unit, the laser irradiation apparatus, the gas supply unit and the fuel supply unit without arrangement of a control unit.

In this connection, it is advantageous for the pulsed power generator 7 to be made such that it is not operated by input of a trigger signal or by operation by the operator when the cooling unit 17 is not being operated.

This arrangement does not yield a high density and high temperature plasma when the aperture component 15 is not cooled. Thus the disadvantage of damage to the aperture component 15 can be reliably prevented.

What we claim is:

1. Extreme UV radiation source device, comprising:
   a vessel;
   a pair of disk-shaped discharge electrodes which are located in said vessel spaced apart at a distance from one another;
   a fuel supply means for supplying liquid or solid extreme UV radiation emitting fuel to at least one of the discharge electrodes;
   a discharge electrode rotation arrangement for rotating said at least one of the discharge electrodes to which the fuel is supplied;
   a vaporization means for vaporizing the fuel supplied to said at least one of the discharge electrodes;
   a power supply means for supplying power between the pair of electrodes; and
   collector optics for focusing the EUV radiation emitted from the high density and high temperature plasma produced from the vaporized fuel being heated and excited by a discharge which forms between the electrodes;

wherein an aperture component with an opening is provided in the vessel between the electrodes and the collector optics, the aperture component dividing the vessel into a region provided with electrodes and a region provided with collector optics, wherein a device for cooling the aperture component is provided and at least the region provided with the electrodes is provided with a pumping means in the vessel.

2. Extreme UV radiation source device in accordance with claim 1, wherein the distance from the electrode on a high voltage side of the pair of electrodes to the aperture component is at least equal to the distance between the pair of discharge electrodes.

3. Extreme UV radiation source device in accordance with claim 1, wherein the pair of disk-shaped discharge electrodes are integrally joined in an essentially concentric arrangement at a distance from one another, and wherein the discharge electrode rotating arrangement turns the integrally joined pair of discharge electrodes.

4. Extreme UV radiation source device in accordance with claim 1, wherein the device for cooling the aperture component comprises a means for causing a coolant to circulate and cool the aperture component.

5. Extreme UV radiation source device in accordance with claim 1, wherein the aperture component is formed of a metal with a high melting point comparable to that of tungsten, and a metal with a good heat conducting property comparable to that of copper that is more easily workable than the metal with a high melting point.

6. Extreme UV radiation source device in accordance with claim 1, wherein the opening formed in the aperture component is in the form of a knife edge that is inclined toward a radiation exit side.

7. Extreme UV radiation source device in accordance with claim 1, wherein a radiation exit side of the aperture component is provided with a means for causing the gas to flow in a sheet-shaped manner transversely across the opening of the aperture component at high speed.

8. Extreme UV radiation source device in accordance with claim 7, wherein means for causing the gas to flow has a gas intake means.

9. Extreme UV radiation source device in accordance with claim 1, wherein a control is provided for preventing operation of the power supply means unless the device for cooling the aperture is operating.

\* \* \* \* \*